United States Patent
Suvanto et al.

(10) Patent No.: US 8,284,958 B2
(45) Date of Patent: Oct. 9, 2012

(54) INCREASED DYNAMIC RANGE MICROPHONE

(75) Inventors: Mikko Veli Aimo Suvanto, Tampere (FI); Andrew Duncan Phelps, Southampton (GB)

(73) Assignee: Nokia Corporation, Espoo (FI)

( * ) Notice: Subject to any disclaimer, the term of this patent is extended or adjusted under 35 U.S.C. 154(b) by 916 days.

(21) Appl. No.: 12/317,323

(22) Filed: Dec. 22, 2008

(65) Prior Publication Data

US 2010/0158274 A1    Jun. 24, 2010

(51) Int. Cl.
*H03G 5/00* (2006.01)
(52) U.S. Cl. .................. 381/103; 381/100; 367/140
(58) Field of Classification Search .......... 381/103, 381/100, 111; 367/140
See application file for complete search history.

(56) References Cited

U.S. PATENT DOCUMENTS

| 5,708,390 | A | * | 1/1998 | Dunnebacke | 330/51 |
| 6,201,873 | B1 | * | 3/2001 | Dal Farra | 381/100 |
| 2007/0140058 | A1 | * | 6/2007 | McIntosh et al. | 367/140 |
| 2009/0052696 | A1 | * | 2/2009 | Iwamatsu | 381/111 |

* cited by examiner

*Primary Examiner* — Phuc Dang
(74) *Attorney, Agent, or Firm* — Harrington & Smith

(57) ABSTRACT

Disclosed herein are apparatus, method, and computer program product whereby a device receives an acoustic signal, where the acoustic signal has a variable sound pressure level. A device outputs an electrical signal from an input audio transducer, where the input audio transducer is connected to a supply voltage. The device determines a distortion level of the electrical signal; and increases or decreases the supply voltage based on the distortion level.

16 Claims, 5 Drawing Sheets

---

2A) Receiving an acoustic signal, where the acoustic signal has a variable sound pressure level.

2B) Outputting an electrical signal from an audio transducer, where the audio transducer is connected to a supply voltage.

2C) Determining a distortion level of the electrical signal.

2D) Varying the supply voltage based on the distortion level.

4A) Determining whether a digital signal has been clipped by measuring the dBFS level of the digital signal.

4B) Varying the sensitivity of the microphone element, when the peak dBFS level of the signal is zero.

5A) Receiving an input from a user.

5B) In response to receiving the input from the user, varying a supply voltage of an input audio transducer to one of selectively increase or decrease sensitivity of the input audio transducer.

INCREASED DYNAMIC RANGE MICROPHONE

TECHNICAL FIELD

The exemplary and non-limiting embodiments of this invention relate generally to improvements in audio capture/recording of high amplitude audio signals.

BACKGROUND

Various abbreviations that appear in the specification and/or in the drawing figures are defined as follows:
ASIC application specific integrated circuit
dB decibels
dBFS decibels full scale
MEMS micro electro-mechanical systems
PDM pulse density modulation
SLIMbus serial low-power inter-chip media bus
SNR signal to noise ratio
SPL sound pressure level
UE user equipment
V volts Audio-visual camcording is one of the most common uses for a mobile device with multimedia capabilities. Advances have been made with respect to the visual capturing components. Customer expectations have in turn risen in regards to the quality of video recordings, however the audio components including both capture and playback have lagged behind the visual side. This may be especially problematic when capturing the video of live events where there are high sound pressure levels (SPL). The internal microphone of the mobile device can saturate when trying to record high SPLs, which are also frequency dependent. The recorded audio signal can result in distortion and compression which influences the overall audio quality.

SUMMARY

A first embodiment of the invention is a method comprising: receiving an acoustic signal, where the acoustic signal has a variable sound pressure level; outputting an electrical signal from an input audio transducer, where the input audio transducer is connected to a supply voltage; determining a distortion level of the electrical signal; and varying the supply voltage based on the distortion level.

Another embodiment of the invention is a computer readable medium encoded with a computer program executable by a processor to perform actions comprising: receiving an acoustic signal, where the acoustic signal has a variable sound pressure level; outputting an electrical signal from an input audio transducer, where the input audio transducer is connected to a supply voltage; determining a distortion level of the electrical signal; and varying the supply voltage based on the distortion level.

Another further embodiment of the invention is an apparatus comprising: an input audio transducer configured to output an electrical signal, in response to receiving an acoustic signal, where the acoustic signal has a variable sound pressure level; and circuitry comprising a charge pump configured to vary a supply voltage connected to the input audio transducer, in response to a determination of a distortion level of the electrical signal.

Another further embodiment of the invention is a method comprising: receiving an input from a user; and in response to receiving the input from the user, varying a supply voltage of an input audio transducer to one of selectively increase or decrease sensitivity of the input audio transducer.

DETAILED DESCRIPTION

Many microphones are unable to record high sound levels without significant compression or distortion of the recorded audio. It has been suggested to use multiple microphone elements. The exemplary embodiments of this invention involve a single microphone element designed to record high sound levels. The microphone element may be coupled to an ASIC. This microphone element's sensitivity may be reduced by reducing a supply voltage connected to the microphone element. The ASIC contains circuitry, such as a charge pump for varying, the supply voltage connected to the microphone element. Reducing the supply voltage reduces the sensitivity of the microphone element. Reducing the sensitivity of the microphone element allows for capturing audio in a high SPL environment without overdriving the microphone element. Exemplary embodiments of this invention provide for use in voice recording and audio-visual recording.

Figure 1:
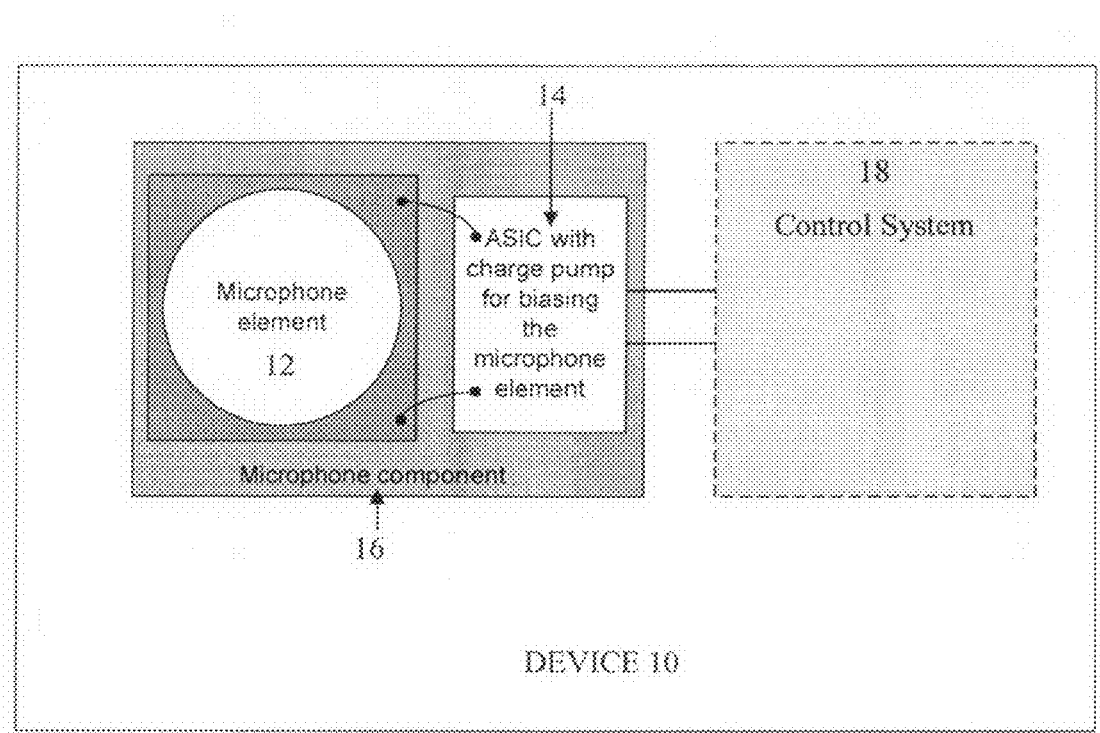
FIG. 1 shows a simplified block diagram of various electronic devices that are suitable for use in practicing the exemplary embodiments of this invention.

Reference is made to FIG. 1 for illustrating various electronic devices that are suitable for use in practicing the exemplary embodiments of this invention. In FIG. 1 a device 10 includes an input audio transducer, also referred to herein as a microphone element 12, circuitry such as an ASIC 14, a microphone component 16, and a control system 18.

The microphone element 12 and the ASIC 14 may be mounted on the microphone component 16. The microphone element 12 is configured to transduce an audio signal, such as an acoustic signal, to an electrical signal. The microphone element 12 is connected with the ASIC 14. The ASIC 14 contains circuitry, such as a charge pump for varying the supply voltage connected to the microphone element. The "supply voltage" may be a biasing voltage, or a phantom power, or in general any supplied potential or current that powers or affects the operation of the microphone element 12. A phantom power is a common power source for condenser microphones. The control system 18 may be optionally coupled to the ASIC 14 to control the operation of the ASIC 14.

In a non-limiting example, the charge pump contained on the ASIC 14 is an electronic circuit that uses capacitors as energy storage elements to create either a higher or lower voltage power source.

The exemplary embodiments of this invention may be implemented at least in part by computer software executable by the ASIC 14 of the device 10, or by hardware, or by a combination of software and hardware.

Figure 3:
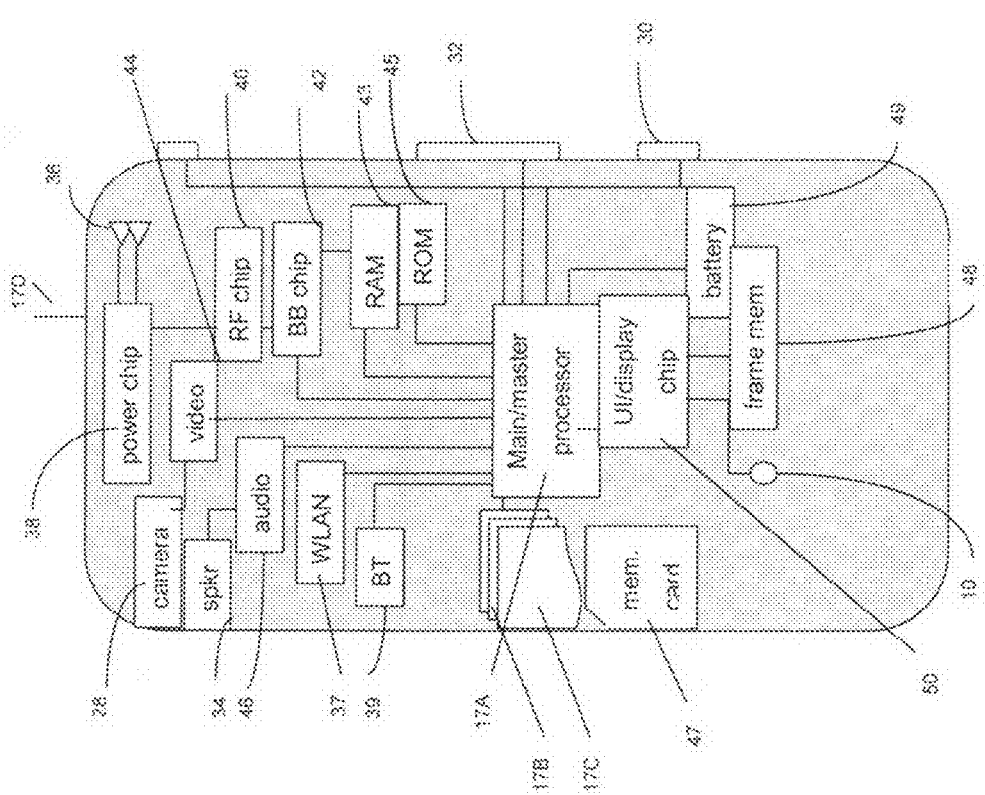
FIG. 3 shows the device of FIG. 1 implemented in an exemplary mobile communications device.
Figure 3:
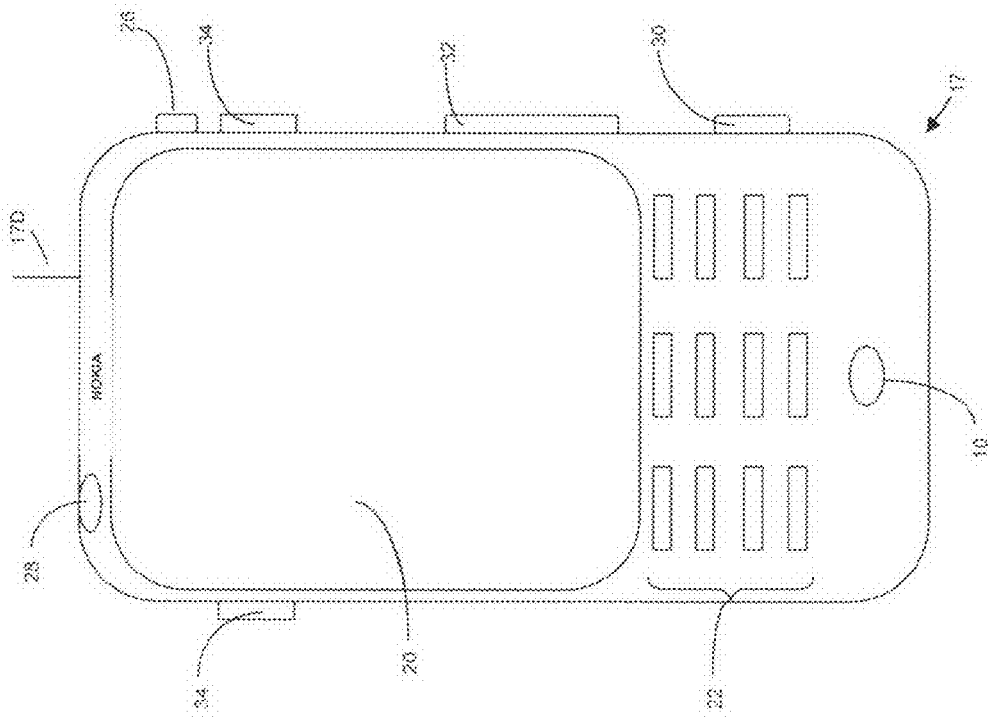

FIG. 3 shows the exemplary embodiment of FIG. 1 (device 10) implemented into a mobile communication device such as UE 17. The UE 17 includes a controller, such as a computer or a data processor (DP) 17A, a computer-readable memory medium embodied as a memory (MEM) 17B that stores a program of computer instructions (PROG) 17C, and a suitable radio frequency (RF) transceiver 17D for bidirectional wireless communications.

In general, the various embodiments of the UE 17 can include, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

The computer readable MEM 17B may be of any type suitable to the local technical environment and may be implemented using any suitable data storage technology, such as semiconductor based memory devices, flash memory, magnetic memory devices and systems, optical memory devices and systems, fixed memory and removable memory. The DP 17A may be of any type suitable to the local technical environment, and may include one or more of general purpose computers, special purpose computers, microprocessors, digital signal processors (DSPs) and processors based on a multicore processor architecture, as non-limiting examples.

FIG. 3 illustrates the UE 17 in both plan view (left) and sectional view (right), and the invention may be embodied in one or some combination of those more function-specific components. The UE 17 has a graphical display interface 20 and a user interface 22 illustrated as a keypad but understood as also encompassing touch-screen technology at the graphical display interface 20 and voice-recognition technology received at the device 10. A power actuator 26 controls the UE 17 being turned on and off by the user. The exemplary UE 17 may have a camera 28 which is shown as being forward facing (e.g., for video calls) but may alternatively or additionally be rearward facing (e.g., for capturing images and video for local storage). The camera 28 is controlled by a shutter actuator 30 and optionally by a zoom actuator 32 which may alternatively function as a volume adjustment for the speaker(s) 34 when the camera 28 is not in an active mode.

Within the sectional view of FIG. 3 are seen multiple transmit/receive antennas 36 that are typically used for cellular communication. The antennas 36 may be multi-band for use with other radios in the UE 17. The operable ground plane for the antennas 36 is shown by shading as spanning the entire space enclosed by the UE 17 housing though in some embodiments the ground plane may be limited to a smaller area, such as disposed on a printed wiring board on which the power chip 38 is formed. The power chip 38 controls power amplification on the channels being transmitted and/or across the antennas that transmit simultaneously where spatial diversity is used, and amplifies the received signals. The power chip 38 outputs the amplified received: signal to the radio-frequency (RF) chip 40 which demodulates and downconverts the signal for baseband processing. The baseband (BB) chip 42 detects the signal which is then converted to a bit-stream and finally decoded. Similar processing occurs in reverse for signals generated in the UE 17 and transmitted from it.

Signals to and from the camera 28 pass through an image/video processor 44 which encodes and decodes the various image frames. A separate audio processor 46 may also be present controlling signals to and from the speakers 34 and the device 10. The graphical display interface 20 is refreshed from a frame memory 48 as controlled by a user interface chip 50 which may process signals to and from the display interface 20 and/or additionally process user inputs from the keypad 22 and elsewhere.

Certain embodiments of the UE 17 may also include one or more secondary radios such as a wireless local area network radio WLAN 37 and a Bluetooth® radio 39, which may incorporate an antenna on-chip or be coupled to an off-chip antenna. Throughout the UE 17 are various memories such as random access memory RAM 43, read only memory ROM 45, and in some embodiments removable memory such as the illustrated memory card 47. The various programs 17C are stored in one or more of these memories. All of these components within the UE 17 are normally powered by a portable power supply such as a battery 49.

The aforesaid processors 38, 40, 42, 44, 46, 50, if embodied as separate entities in the UE 17, may operate in a slave relationship to the main processor 17A, which may then be in a master relationship to them.

Note that the various chips (e.g., 38, 40, 42, etc.) that were described above may be combined into a fewer number than described and, in a most compact case, may all be embodied physically within a single chip.

The ASIC 14 of device 10 may be implemented into the user interface chip 50 instead of device 10. Additionally the control system 18 may be implemented into the user interface chip 50.

The exemplary embodiments of this invention may be implemented using a MEMS microphone.

The exemplary embodiments of this invention may be implemented using a multiple microphone array.

In one exemplary embodiment of this invention an acoustic signal is received by the microphone element 12. The microphone element 12 outputs an electrical signal corresponding to the received acoustic signal. In a non-limiting example, the microphone element 12 has a maximum SPL between 120 dB and 140 dB. The ASIC 14 determines the level of output distortion of the electrical signal. Output distortion may be determined by evidence of signal clipping. Signal clipping causes distortion and consequentially the audio quality suffers. The level of signal clipping is equivalent to the level of output distortion. In a non-limiting example, signal clipping of digital signals occurs when a peak dBFS level of zero is measured. A dBFS level is the decibel amplitude level of a signal. The ASIC 14 automatically varies (increases or decreases) the supply voltage connected to the microphone element 12 based on the level of output distortion. In a non-limiting example, the ASIC 14 may decrease the supply voltage by as much as 10 V. As mentioned above, a decreased supply voltage results in a reduced sensitivity of the microphone element 12. Reducing the sensitivity of the microphone element 12 allows for capturing audio in a high SPL environment without overdriving the microphone element 12.

Figure 4:
FIG. 4 shows a non-limiting example of a method to reduce a microphone elements sensitivity.

Reference is made to FIG. 4 for showing a non-limiting example of reducing the sensitivity of the microphone element 12. At Block 4A, there is the step of determining whether a digital signal has been clipped by measuring the dBFS level of the digital signal; and at Block 4B, there is the step of varying the sensitivity of the microphone element 12, when the peak dBFS level of the signal is zero.

In another exemplary embodiment of this invention, another device, such as UE 17, determines the level of output distortion of the electrical signal. The another device then instructs the ASIC 14 to vary (increase or decrease) the supply voltage connected to the microphone element 12 based on the level of output distortion. The another device may be a camcorder, mobile phone, or any other device capable of housing or controlling components used for audio capture. A SLIMbus (Serial Low-power Inter-chip Media Bus) could be used for interfacing the another device with the ASIC 14.

In a further exemplary embodiment of this invention, a user may instruct the device 10 to vary the supply voltage. This may be accomplished by the user setting the device 10 to a high SPL mode. A high SPL mode may correspond to instances where the user believes any received acoustic signal will be loud and there is a high probability for signal distortion to occur. This mode may be changed by the user during the receipt of the acoustic signal or at any time. In response to the user setting the mode, the ASIC 14 decreases or varies the supply voltage connected to the microphone element 12 to allow for capturing of the audio without distortion. A SLIMbus could be used for interfacing the user input to the ASIC 14. The mode may be on another device that connects to device 10, such as a mobile device. In a non-limiting example, the mobile device may contain a user interface that enables the user to instruct the device 10 to vary the supply voltage. The user interface may contain a predetermined button, softkey, or an item on a menu that the user may select to instruct the device 10 to vary the supply voltage. The mobile device may contain a display that outputs the current SPL. Additionally, the mobile device may alert the user when the current SPL is above an accepted value. An alert may be in audio, mechanical (such as a vibration), or visual form. An accepted value may be a value where there is a high probability for signal distortion to occur. In a non-limiting example, an accepted value may be 120 dB.

In an even further exemplary embodiment of this invention changing the sensitivity of the microphone element 12 may be accomplished via receipt of a digital command sequence. The digital command may be sent to an existing pad of the device 10. The digital command may be sent from another device or from a user. The pad may be, for example, a data pin, therefore reducing any need for an additional pin.

Figure 2:
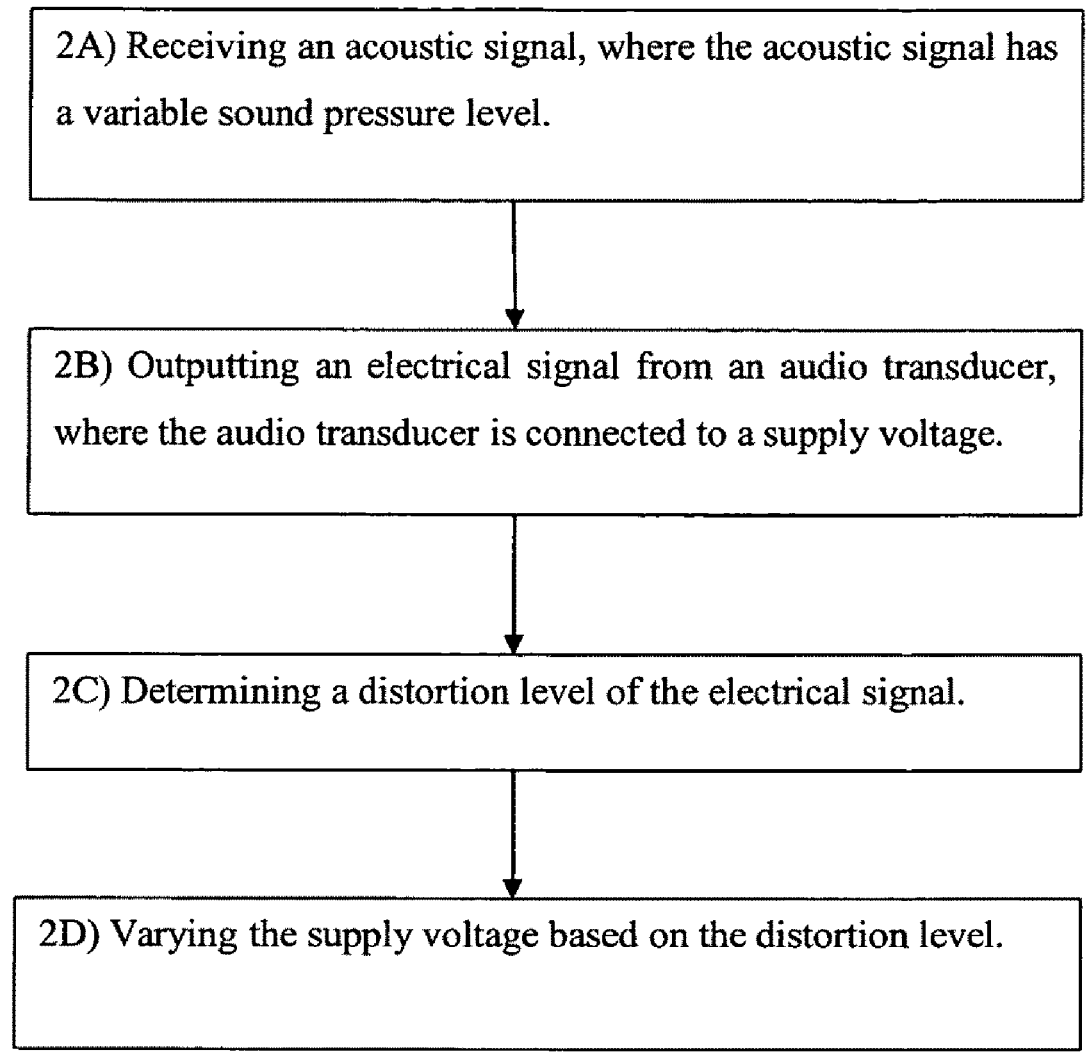
FIG. 2 is a logic flow diagram that illustrates a method, and the result of execution of computer program instructions, at the device in accordance with exemplary embodiments of this invention.

(A) Referring to FIG. 2, in accordance with an exemplary method at Block 2A, there is a step of receiving an acoustic signal at an input audio transducer, where the acoustic signal has a variable sound pressure level; and at Block 2B there is a step of outputting an electrical signal from an input audio transducer, where the input audio transducer is connected to a supply voltage; and at Block 2C there is a step of determining a distortion level of the electrical signal; and at Block 2D there is a step of varying the supply voltage based on the distortion level.

(B) The method in paragraph (A), where the distortion level is detected automatically by circuitry and the circuitry varies the supply voltage.

(C) The method as in paragraph (A), where the distortion level is detected by another device and the another device instructs circuitry to vary the supply voltage.

(D) The method as in paragraph (C), where the another device is a mobile phone.

(E) The method as in paragraph (C), where the another device is a camcorder.

(G) The method as in one of paragraphs (A)-(E), implemented into a micro-electro-mechanical system microphone.

(H) The method as in one of paragraphs (A)-(E), implemented into a multiple microphone array.

(I) The method as in one of paragraphs (B)-(H), where the circuitry is implemented onto an application specific integrated circuit.

It should be further appreciated that the exemplary embodiments of this invention pertain to apparatus at the device 10, which may be embodied as an input audio transducer configured to output an electrical signal, in response to receiving an acoustic signal, where the acoustic signal has a variable sound pressure level; and circuitry comprising a charge pump configured to vary a supply voltage connected to the input audio transducer, in response to a determination of a distortion level of the electrical signal.

Figure 5:
FIG. 5 is a logic flow diagram that illustrates a method, and the result of execution of computer program instructions, at the device in accordance with exemplary embodiments of this invention.

(J) Referring to FIG. 5, in accordance with an exemplary method at Block 4A, there is a step of receiving an input from a user; and at Block 4B in response to receiving the input from the user, there is a step of varying a supply voltage of an input audio transducer to one of selectively increase or decrease sensitivity of the input audio transducer.

(K) The method as in paragraph (J), where receiving an input from a user is via a user interface of a mobile device.

The various blocks shown in FIGS. 2 and 5 may be viewed as method steps, and/or as operations that result from operation of computer program code, and/or as a plurality of coupled logic circuit elements constructed to carry out the associated function(s).

In general, the various exemplary embodiments may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the exemplary embodiments of this invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

It should be noted that the terms "connected," "coupled," or any variant thereof, mean any connection or coupling, either direct or indirect, between two or more elements, and may encompass the presence of one or more intermediate elements between two elements that are "connected" or "coupled" together. The coupling or connection between the elements can be physical, logical, or a combination thereof. As employed herein two elements may be considered to be "connected" or "coupled" together by the use of one or more wires, cables and/or printed electrical connections, as well as by the use of electromagnetic energy, such as electromagnetic energy having wavelengths in the radio frequency region, the microwave region and the optical (both visible and invisible) region, as several non-limiting and non-exhaustive examples.

Furthermore, some of the features of the various non-limiting and exemplary embodiments of this invention may be used to advantage without the corresponding use of other features. As such, the foregoing description should be considered as merely illustrative of the principles, teachings and exemplary embodiments of this invention, and not in limitation thereof.

What is claimed is:

1. A method, comprising:
   receiving an acoustic signal, where the acoustic signal has a variable sound pressure level;
   outputting an electrical signal from an input audio transducer based on the acoustic signal, where the input audio transducer is connected to a supply voltage;
   determining a distortion level of the electrical signal; and
   varying the supply voltage for changing the sensitivity of the input audio transducer based on the distortion level.

2. The method as in claim 1, where the distortion level is detected automatically by circuitry and the circuitry varies the supply voltage.

3. The method as in claim 1, where the distortion level is detected by another device and the another device instructs circuitry to vary the supply voltage.

4. The method as in claim 3, where the another device is a mobile phone.

5. The method as in claim 4, where the another device is a camcorder.

6. The method as in claim 1, implemented into a micro-electro mechanical system microphone.

7. The method as in claim 1, implemented into a multiple microphone array.

8. The method as in claim 2, where the circuitry is implemented onto an application specific integrated circuit.

9. A computer readable medium encoded with a computer program executable by a processor to perform actions comprising:
   receiving an acoustic signal, where the acoustic signal has a variable sound pressure level;
   outputting an electrical signal from an input audio transducer based on the acoustic signal, where the input audio transducer is connected to a supply voltage;
   determining a distortion level of the electrical signal; and
   varying the supply voltage for changing the sensitivity of the input audio transducer based on the distortion level.

10. An apparatus, comprising:
    an input audio transducer configured to output an electrical signal based on receiving an acoustic signal, where the acoustic signal has a variable sound pressure level; and
    circuitry comprising a charge pump configured to vary a supply voltage connected to the input audio transducer for changing the sensitivity of the input audio transducer in response to a determination of a distortion level of the electrical signal.

11. The apparatus as in claim 10, where the circuitry is configured to vary the supply voltage in response to either the circuitry determining the distortion level of the electrical signal or receiving the distortion level of the electrical signal from another device.

12. The apparatus as in claim 11, where the another device is a mobile phone.

13. The apparatus as in claim 11, where the another device is a camcorder.

14. The apparatus as in claim 10, implemented into a microphone array.

15. The apparatus as in claim 10, implemented into a micro-electro mechanical systems microphone.

16. The apparatus as in claim 10, where the circuitry is an application specific integrated circuit.

* * * * *